United States Patent
Liu

(10) Patent No.: US 8,739,008 B2
(45) Date of Patent: May 27, 2014

(54) METHOD FOR DETERMINING PARITY CHECK MATRIX UTILIZED IN FLASH MEMORY SYSTEM AND RELATED FLASH MEMORY SYSTEM THEREOF

(75) Inventor: Zhen-U Liu, Pingzhen (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 163 days.

(21) Appl. No.: 13/402,725

(22) Filed: Feb. 22, 2012

(65) Prior Publication Data

US 2013/0219249 A1    Aug. 22, 2013

(51) Int. Cl.
*H03M 13/00* (2006.01)

(52) U.S. Cl.
USPC ........... 714/786; 714/773; 714/758; 714/755; 375/240.24; 375/240.27; 341/51; 341/56; 341/67

(58) Field of Classification Search
USPC ............. 714/773, 758, 786, 755; 375/240.24, 375/240.27; 341/51, 56, 67
See application file for complete search history.

(56) References Cited

U.S. PATENT DOCUMENTS

| | | | | |
|---|---|---|---|---|
| 7,149,362 | B2 * | 12/2006 | Lafruit et al. | 382/240 |
| 7,295,137 | B2 * | 11/2007 | Liu et al. | 341/51 |
| 2003/0033471 | A1 * | 2/2003 | Lin et al. | 711/103 |
| 2011/0264986 | A1 * | 10/2011 | Chin et al. | 714/763 |

* cited by examiner

*Primary Examiner* — Guy Lamarre
(74) *Attorney, Agent, or Firm* — McClure, Qualey & Rodack, LLP

(57) ABSTRACT

A method for determining a parity check matrix utilized in a flash memory system is disclosed. The parity check matrix comprises M×N blocks. The method includes generating a first set of candidate blocks as candidates of a first set of blocks of the M×N blocks; calculating a plurality of first estimated results corresponding to the first set of candidate blocks; determining content of a first block of the M×N blocks according to a best result of the first estimated results; generating a second set of candidate blocks as candidates of a second set of blocks of the M×N blocks; calculating a plurality of second estimated results corresponding to the second set of candidate blocks by considering the content of the first block; determining content a second block of the M×N blocks according to the second estimated results.

20 Claims, 11 Drawing Sheets

$$I_0 = \begin{pmatrix} 0 & 0 & 0 & \cdots\cdots\cdots\cdots & 0 & 0 & 0 \\ 0 & 0 & 0 & 0 \cdots\cdots\cdots\cdots & 0 & 0 & 0 \\ 0 & 0 & 0 & 0 & 0 \cdots\cdots\cdots\cdots & 0 & 0 & 0 \\ 0 & 0 & 0 & 0 & 0 & 0 \cdots\cdots & 0 & 0 & 0 \\ 0 & \cdots\cdots & & & & & \cdots\cdots & 0 \\ 0 & \cdots\cdots & & & & & \cdots\cdots & 0 \\ 0 & 0 & 0 & \cdots\cdots\cdots\cdots\cdots & 0 & 0 & 0 \\ 0 & 0 & 0 & \cdots\cdots\cdots\cdots\cdots & 0 & 0 & 0 \end{pmatrix}$$

Z × Z $$I_1 = \begin{pmatrix} 1 & 0 & 0 & \cdots\cdots\cdots\cdots & 0 & 0 & 0 \\ 0 & 1 & 0 & 0 \cdots\cdots\cdots\cdots & 0 & 0 & 0 \\ 0 & 0 & 1 & 0 & 0 \cdots\cdots\cdots & 0 & 0 & 0 \\ 0 & 0 & 0 & 1 & 0 & 0 \cdots\cdots & 0 & 0 & 0 \\ 0 & \cdots\cdots & & & & & \cdots\cdots & 0 \\ 0 & \cdots\cdots & & & & & \cdots\cdots & 0 \\ 0 & 0 & 0 & \cdots\cdots\cdots\cdots & 0 & 1 & 0 \\ 0 & 0 & 0 & \cdots\cdots\cdots\cdots & 0 & 0 & 1 \end{pmatrix}$$

$$I_2 = \begin{pmatrix} 0 & 1 & 0 & 0 & 0 \cdots\cdots\cdots & 0 & 0 & 0 \\ 0 & 0 & 1 & 0 & 0 & 0 \cdots\cdots & 0 & 0 & 0 \\ 0 & \cdots\cdots & & & & \cdots\cdots & 0 \\ 0 & \cdots\cdots & & & & \cdots\cdots & 0 \\ 0 & 0 & 0 & \cdots\cdots\cdots\cdots & 0 & 1 & 0 \\ 0 & 0 & 0 & \cdots\cdots\cdots\cdots & 0 & 0 & 1 \\ 1 & 0 & 0 & \cdots\cdots\cdots\cdots & 0 & 0 & 0 \end{pmatrix}$$

$I_1$ shift 1

$\vdots$ $$I_Z = \begin{pmatrix} 0 & 0 & 0 & \cdots\cdots\cdots\cdots & 0 & 0 & 1 \\ 1 & 0 & 0 & \cdots\cdots\cdots\cdots & 0 & 0 & 0 \\ 0 & 0 & 1 & 0 & 0 \cdots\cdots\cdots & 0 & 0 & 0 \\ 0 & 0 & 0 & 1 & 0 & 0 \cdots\cdots & 0 & 0 & 0 \\ 0 & \cdots\cdots & & & & \cdots\cdots & 0 \\ 0 & \cdots\cdots & & & & \cdots\cdots & 0 \\ 0 & 0 & 0 & \cdots\cdots\cdots\cdots & 0 & 1 & 0 \end{pmatrix}$$

$I_1$ shift Z-1

METHOD FOR DETERMINING PARITY CHECK MATRIX UTILIZED IN FLASH MEMORY SYSTEM AND RELATED FLASH MEMORY SYSTEM THEREOF

BACKGROUND OF THE INVENTION

1. Field of the Invention

The disclosed embodiments of the present invention relate to a method for determining a parity check matrix utilized in a flash memory system, and more particularly, to a method for determining a low-density parity check based parity check matrix utilized to decode data stored in the flash memory system by exhaustively calculating a plurality of estimated results corresponding to any possible candidate blocks.

2. Description of the Prior Art

Communication of information between computers and other electronic devices can be implemented using any of a variety of different standards and technologies. Channel coding and error correction techniques may be used to reduce errors in received signals introduced from distortion and other disturbances. Such coding and error correction may be implemented using an encoder and a decoder at the ends of the transmission channel.

For example, any algorithm for low-density parity check (LDPC) codes may be used in a flash memory system to encode the received data, and the encoded data (codeword) can be then stored in a flash memory. On the other hand, iterative decoders are often used to converge on a correct decoded value while decoding the codeword. In one implementation, LDPC decoding is performed in the receiving end using a soft-decision, message-passing algorithm (MPA). The received bits (e.g., channel values) are treated as variables each representing the probability of the value being a "0" or a "1", and the variables are represented in the decoding algorithm as log likelihood ratios (LLRs). The message-passing algorithm passes messages (e.g., LLRs) from the variable nodes to the check nodes, calculates the syndrome of the current iteration, passes messages (e.g., LLRs) from the check nodes to the variable nodes, and iterates in this same way until a convergence is reached (e.g., check bits of the syndrome are all 0's).

However, one of the problems inherent to LDPC codes is the presence of trapping set(s). A trapping set is the set of bits that cannot be decoded to the correct values after any given number of iterations. Regarding an LDPC decoder with high signal-to-noise (SNR) additive white Gaussian noise (AWGN), an error type is a small trapping set. In general, the error bit number of the received bits is usually small. However, if the errors are located at some specific variable nodes, they would feed back wrong reliability values and cause a trapping set. To put it simply, when decoding a received codeword, an LDPC decoder may encounter one or more trapping sets that prevent the decoder from properly decoding the received codeword. The minimum bit error rate of a specific LDPC code may be dominated by the number of trapping sets inherently existed in the LDPC code.

Thus, there is a need for effectively finding or determining a LDPC code which inherently has a minimum number of trapping set(s). In the other words, there is a need for effectively finding or determining a parity check matrix for defining a LDPC code which has a best performance in error correction.

SUMMARY OF THE INVENTION

In accordance with exemplary embodiments of the present invention, a method for determining a low-density parity check (LDPC) based parity check matrix utilized to decode data stored in the flash memory system by exhaustively calculating a plurality of estimated results corresponding to any possible candidate blocks and a related memory system thereof are proposed to solve the above-mentioned problem.

According to a first aspect of the present invention, a method for determining a parity check matrix utilized in a flash memory system is disclosed. The flash memory system reads data from a flash memory and decodes data with the parity check, and the parity check matrix defines a LDPC code and comprises M×N blocks, M being a number of blocks of a column in the parity check matrix and N being a number of blocks of a row in the parity check matrix. The method comprises generating a first set of candidate blocks as candidates of a first set of blocks of the M×N blocks; calculating a plurality of first estimated results corresponding to the first set of candidate blocks; determining content of a first block of the M×N blocks according to a best result of the first estimated results; generating a second set of candidate blocks as candidates of a second set of blocks of the M×N blocks; calculating a plurality of second estimated results corresponding to the second set of candidate blocks by considering the content of the first block; determining content a second block of the M×N blocks according to the second estimated results.

According to a second aspect of the present invention, an exemplary flash memory system utilizes a parity check matrix is disclosed. The flash memory system reads data from a flash memory and decodes data with the parity check matrix, and the parity check matrix defines a LDPC code and comprises M×N blocks, M being a number of blocks of a column in the parity check matrix and N being a number of blocks of a row in the parity check matrix. The method comprises generating a first set of candidate blocks as candidates of a first set of blocks of the M×N blocks; calculating a plurality of first estimated results corresponding to the first set of candidate blocks; determining content of a first block of the M×N blocks according to a best result of the first estimated results; generating a second set of candidate blocks as candidates of a second set of blocks of the M×N blocks; calculating a plurality of second estimated results corresponding to the second set of candidate blocks by considering the content of the first block; determining content of a second block of the M×N blocks according to the second estimated results.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram illustrating candidate blocks can be utilized in the parity check matrix.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
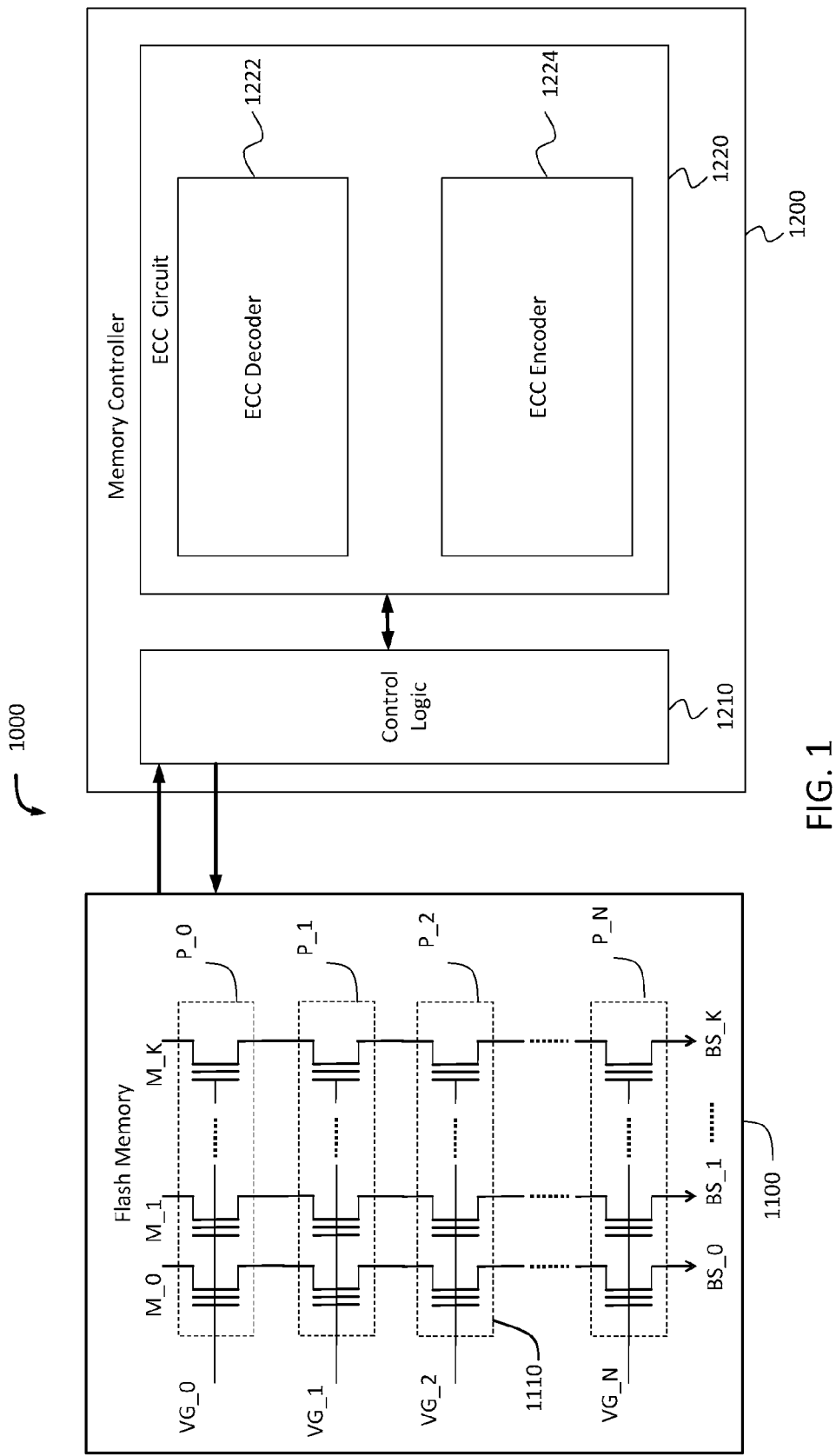
FIG. 1 is a diagram illustrating block diagrams of a flash memory system according to a first exemplary embodiment of the present invention.

Please refer to FIG. 1, which is a diagram illustrating a flash memory system according to an exemplary embodiment of the present invention. The exemplary memory system 1000 includes a flash memory 1100 and a memory controller 1200. In this exemplary embodiment, the flash memory 1100 may be a NAND-type flash memory including a plurality of physical pages $P\_0, P\_1, P\_2, \ldots, P\_N$, wherein each of the physical pages $P\_0$-$P\_N$ includes a plurality of memory cells (e.g., floating-gate transistors) 1110. For example, as to a target physical page $P\_0$ to be read, it has memory cells $M\_0$-$M\_K$ included therein. To read the data stored in the memory cells $M\_0$-$M\_K$ of the target physical page $P\_0$, the control gate voltages $VG\_0$-$VG\_N$ should be properly set. For example, the control gate voltages $VG\_1$-$VG\_N$ should be properly set to ensure that all of the memory cells (floating-gate transistors) 1110 of the physical pages $P\_1$-$P\_N$ are conductive. In a case where each of the memory cell 1110 is configured to store N bits (e.g., three bits including a least significant bit (LSB), a central significant bit (CSB), and a most significant bit (MSB), the flash memory 1100 sets the control gate voltage $VG\_0$ to $(2^N-1)$ voltage levels for identifying all of the N bits of each memory cell 1110 of the target physical page $P\_0$. In addition, to store data to the memory cells $M\_0$-$M\_K$ of the target physical page $P\_0$, the data should be properly encoded for ensuring the correctness of data storage.

Please refer to FIG. 1 again. The memory controller 1200 is implemented to control access (read/write) of the flash memory 1100, and includes, but is not limited to, a control logic 1210 and an ECC circuit 1220. Please note that only the elements pertinent to the technical features of the present invention are shown in FIG. 1. That is, the memory controller 1200 may include additional elements to support other functionality. Generally, when receiving a read request for data stored in the memory cells $M\_0$-$M\_K$ of the target physical page $P\_0$, the control logic 1210 is operative for controlling the flash memory 1100 to read requested data. As known to those skilled in the art, part of the memory cells 1110 of one physical page is utilized for storing ECC information (e.g., an ECC code). Thus, the ECC circuit 1220 is operative to perform an ECC operation upon the readout information (e.g., a codeword) read from the physical page. In this exemplary embodiment, the ECC circuit 1220 includes an ECC decoder 1222 and an ECC encoder 1224. The ECC decoder 1222 is implemented for checking the correctness of the readout information, thereby detecting the existence of any error bits. When the existence of any error bits is detected, the ECC decoder 1222 is operative for correcting error bits found in the checked readout information. However, when the number of error bits existing in the readout information exceeds a maximum number of error bits that can be corrected by the ECC decoder 1222, the ECC decoder 1222 indicates that the readout information includes uncorrectable error bits. Thus, the control logic 1210 may enable a reread operation upon the target physical page $P\_0$ for obtaining the readout information which can pass the ECC parity check performed by the ECC circuit 1220 or may report a read fail. The reread operation degrades the performance of the flash memory system. The read fail is almost not acceptable for users.

Figure 2:
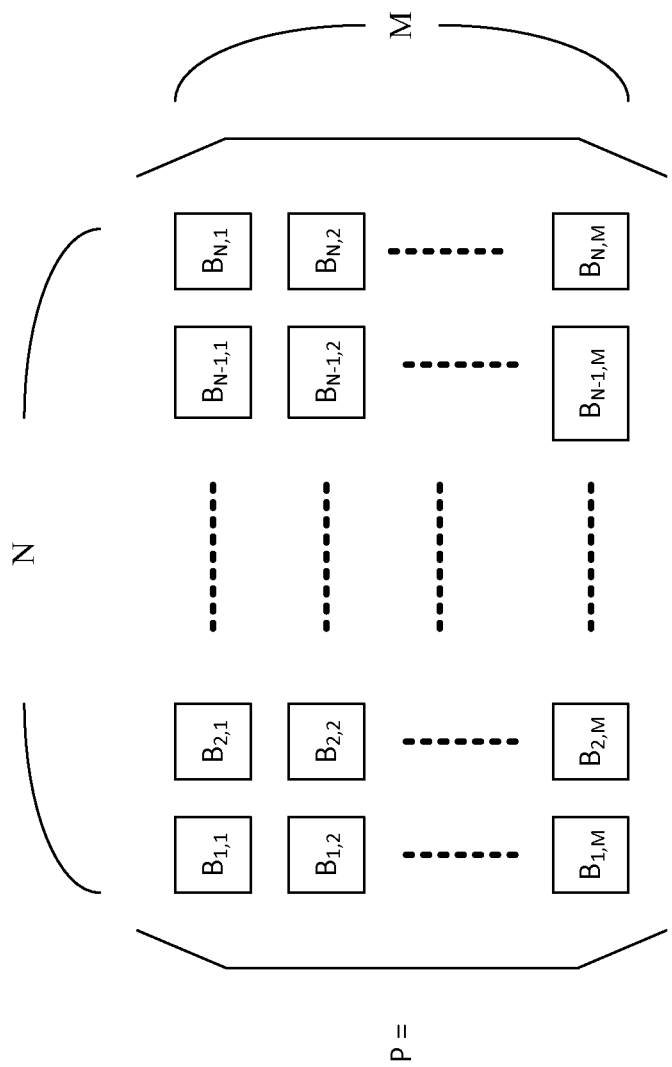
FIG. 2 is a diagram illustrating a parity check matrix utilized in the flash memory system.

One way to enhance the error correction capability of the ECC circuit 1220 is selecting a proper error correction code utilized for decoding. When receiving a read request for reading data stored in the memory cells $M\_0$-$M\_K$ of a target physical page $P\_1$, the control logic 1210 is operative for controlling the flash memory 1100 to read data. As mentioned above, the data has been properly encoded for ensuring the correctness of data storage. The ECC decoder 1222 is implemented for decoding the data read from the flash memory 1100 with a parity check matrix to generate correct data. The parity check matrix may be implemented in the form of hardware, software, or firmware. Generally speaking, the parity check matrix utilized by the ECC decoder 1222 defines a specific error correction code, for example a code based on massage-passing algorithm (MPA) algorithm or a low-density parity check (LDPC) code. FIG. 2 is a diagram illustrating a parity check matrix utilized in the flash memory system 1000. The parity check matrix comprises M×N blocks, i.e. $B_{1,1}, B_{2,1}, B_{N,M}$. M is a number of blocks of a column in the parity check matrix, and N is a number of blocks of a row in the parity check matrix. For example, in the first column of the parity check matrix, there is M blocks, comprising $B_{1,1}, B_{1,2}, \ldots, B_{1,M}$. In the first row of the parity check matrix, there is N blocks, comprising $B_{1,1}, B_{2,1}, \ldots, B_{N,1}$. Each block of the M×N blocks is a square matrix and has the same horizontal and vertical dimensions. The selection of each block of the M×N blocks is a key point to generate a parity check matrix that is appropriate for the flash memory system 1000. Please note that the parity check matrix defines a quasi-cyclic LDPC (QC-LDPC) code. Further details are illustrated below.

FIG. 3 is a diagram illustrating candidate blocks can be utilized in the parity check matrix. As mentioned above, each block of the M×N blocks is a square matrix and has the same horizontal and vertical dimensions. All of the candidate blocks can be utilized in the parity check matrix and have the same horizontal and vertical dimensions Z. An initial candidate block $I_0$ is a Z×Z square matrix with all zeros. A first candidate block $I_1$ is an identity matrix of size Z. The identity matrix of size Z is the Z×Z square matrix with ones on the main diagonal and zeros elsewhere. The other candidate blocks are shifted identity matrix with different shift value. For example, a second candidate block $I_2$ is a shifted identity matrix with shift value 1. A third candidate block $I_3$ is a shifted identity matrix with shift value 2. A $Z^{th}$ candidate block $I_Z$ is a shifted identity matrix with shift value Z−1. Please note that the block size (i.e. Z), the number of blocks of a column (i.e.

row weight M) in the parity check matrix, and the number of blocks of a row (i.e. column weight N) in the parity check matrix should be predetermined according to the desired code rate and desired code length. Any block of the candidate blocks can be determined as one block of the M×N blocks. In the parity check matrix, the combination of the candidate blocks shall dominate the characteristic and performance of the parity check matrix. One way to find out or determine a best parity check matrix under a predetermined block size, row weight, and column weight is exhaustively find out any possible combinations of the candidate blocks and calculates all corresponding results (performance of each combination). In this way, the best parity check matrix can be found, and lots of time and resource should be wasted. The complexity of exhaustively finding out any possible combinations of the candidate blocks and calculating all corresponding results shall proportional to $(Z+1)^{M*N}$. An exemplary embodiment of a method for effectively searching or determining the parity check matrix is illustrated in detail below.

Figure 4:
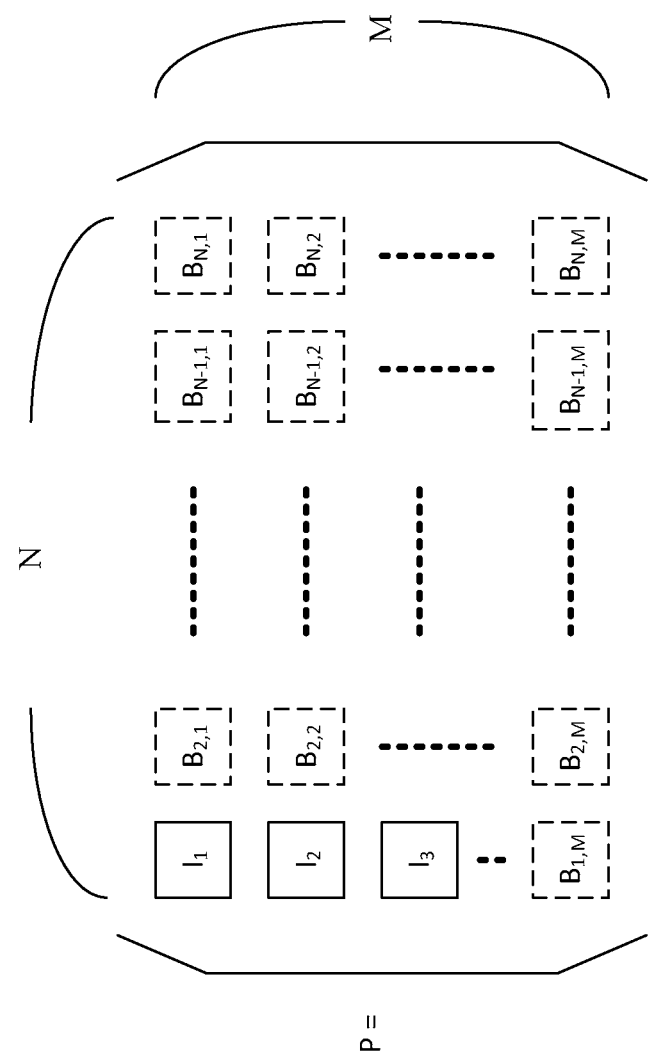
FIG. 4 is a diagram illustrating an exemplary embodiment of a first set of candidate blocks that are candidates of a first set of blocks of the parity check matrix.
Figure 5:
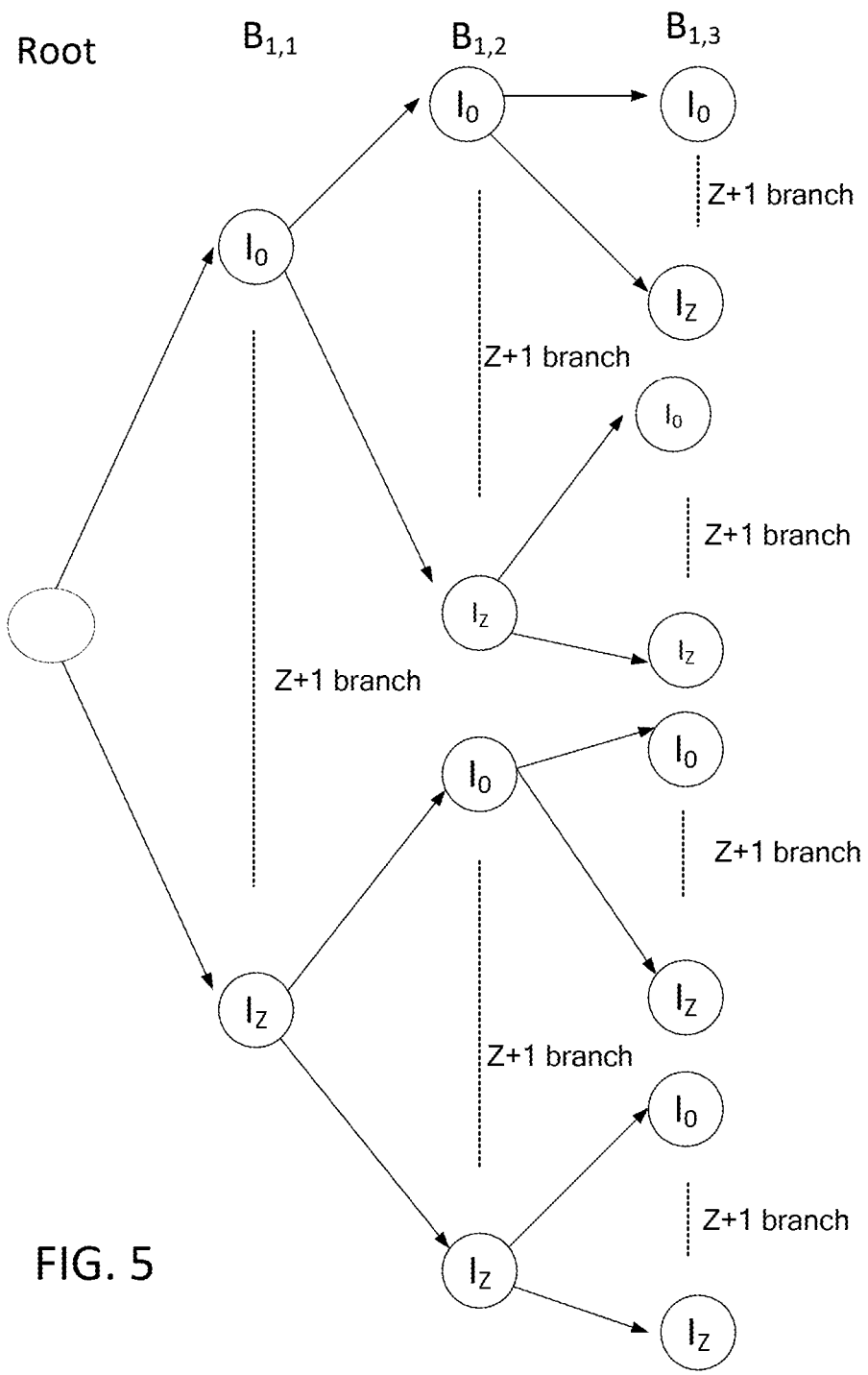
FIG. 5 is a diagram illustrating a trellis diagram for determining a best result from the first set of candidate blocks.

Please refer to FIG. 4 in conjunction with FIG. 5. FIG. 4 is a diagram illustrating an exemplary embodiment of a first set of candidate blocks that are candidates of a first set of blocks of the parity check matrix. FIG. 5 is a diagram illustrating a trellis diagram for determining a best result from the first set of candidate blocks. In FIG. 4, the first set of blocks of the parity check matrix comprises blocks $B_{1,1}$, $B_{1,2}$, and $B_{1,3}$. In this embodiment, the number of blocks of the first set of the blocks is three blocks, however, the number of blocks of the first set of the blocks is an example rather than a limitation. The number of blocks of the first set of the blocks can be deemed as a window size of the trellis diagram. The window size should be predetermined. For a block in the M×N blocks, e.g. the block $B_{1,1}$, the content of the block can be determined as any block of all candidate blocks. For example, the content of the block $B_{1,1}$ can be determined as any one of candidate blocks $I_0, I_1, I_2, I_3, \ldots$ or $I_Z$. The content of the block $B_{1,2}$ can be determined as any one of candidate blocks $I_0, I_1, I_2, I_3, \ldots$ or $I_Z$. The content of the block $B_{1,3}$ can be determined as any one of candidate blocks $I_0, I_1, I_2, I_3, \ldots$ or $I_Z$. In FIG. 5, the trellis diagram illustrates all possible combinations of the candidate blocks. Each branch of the trellis diagram is a possible combination of the candidate blocks. A first set of candidate blocks that are candidates of a first set of blocks of the parity check matrix comprises all of the possible combinations of the candidate blocks, i.e. all branches of the trellis diagram. In one embodiment, as shown in the FIG. 4, the content of the block $B_{1,1}$ is presumed as the first candidate block $I_1$, the content of the block $B_{1,2}$ is presumed as the second candidate block $I_2$, and the content of the block $B_{1,3}$ is presumed as the third candidate block $I_3$, which is a possible combination of the candidate blocks. The performance (result) of the parity check matrix having the possible combination, the content of block $B_{1,1}$=the first candidate block $I_1$, the content of block $B_{1,2}$=the second candidate block $I_2$, and the content of block $B_{1,3}$=the third candidate block $I_3$, can be estimated. In addition, all results corresponding to all possible combinations of the candidate blocks (i.e. the first set of candidate blocks) can be estimated. In other words, $(Z+1)^3$ results corresponding to $(Z+1)^3$ branches can be estimated. The content of a first block, i.e. block $B_{1,1}$, can be determined according to a best result of the first estimated results. For example, the parity check matrix having the combination, the content of block $B_{1,1}$=the first candidate block $I_1$, the content of block $B_{1,2}$=the second candidate block $I_2$, and the content of block $B_{1,3}$=the third candidate block $I_3$, has a best performance. Hence, the content of the block$_{1,1}$ is determined as the first candidate block $I_1$.

The performance of a LDPC code is mainly judged according to the waterfall region and the error floor region. Particularly, for a storage system, the error floor region that indicates a minimum bit error rate of a LDPC code is an important property. The error floor region is dominated by trapping sets which are constructed with the girth bundle. Hence, one way to determine the best result from the first estimated results is by considering a number of girth of each result of the first estimated results. The girth has different types. The girth is a pass circle between check nodes and variable nodes. According to pass length, there are girth 4, girth 6, girth 8 and so on. A type of the girth is so called girth four. The girth four is composed of 2 variable nodes and 2 check nodes, wherein each variable node has two massage passing paths connecting to two check nodes, respectively. Another type of the girth is so called girth six. The girth six is composed of 3 variable nodes and 3 check nodes, wherein each variable node has two massage passing paths connecting to two check nodes, respectively. A LDPC code having less number of girth four is a better code. Similarly, a LDPC code having less number of girth six is a better code. The girth four will degrade the performance of the LDPC code more seriously than that the girth six will. Hence, the number of girth four should be considered in a higher priority while determining the best result from the first set of results. The best result has a minimum number of girth four (or has no girth four). If a plurality of results of the first estimated results have the same number of girth four (or have no girth four), the number of girth six should be considered for determining the best result. In this case, the best result has a minimum number of girth six. Otherwise, if a plurality of results of the first estimated results have the same number of girth four and girth six, arbitrarily determining a result of the results as the best result. Please note that we can find a LDPC code with girth 4 free easily, but it is very hard to find a code with girth 6 free.

Figure 6:
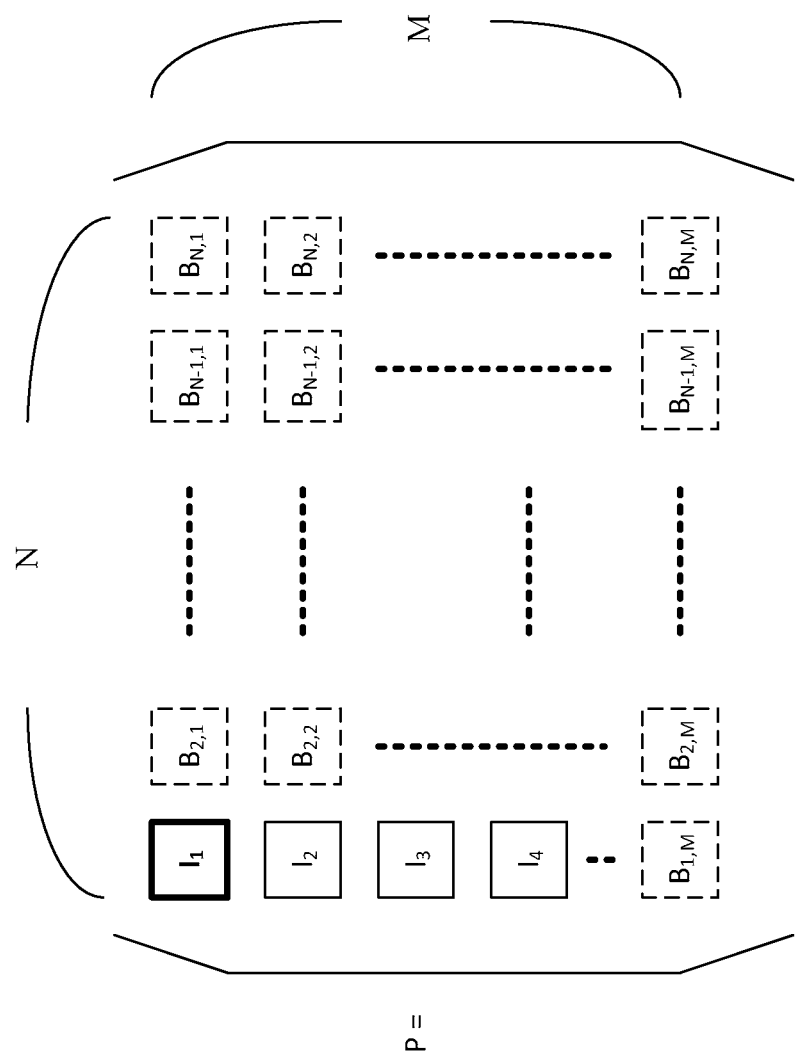
FIG. 6 a diagram illustrating an exemplary embodiment of a second set of candidate blocks that are candidates of a second set of blocks of the parity check matrix.
Figure 7:
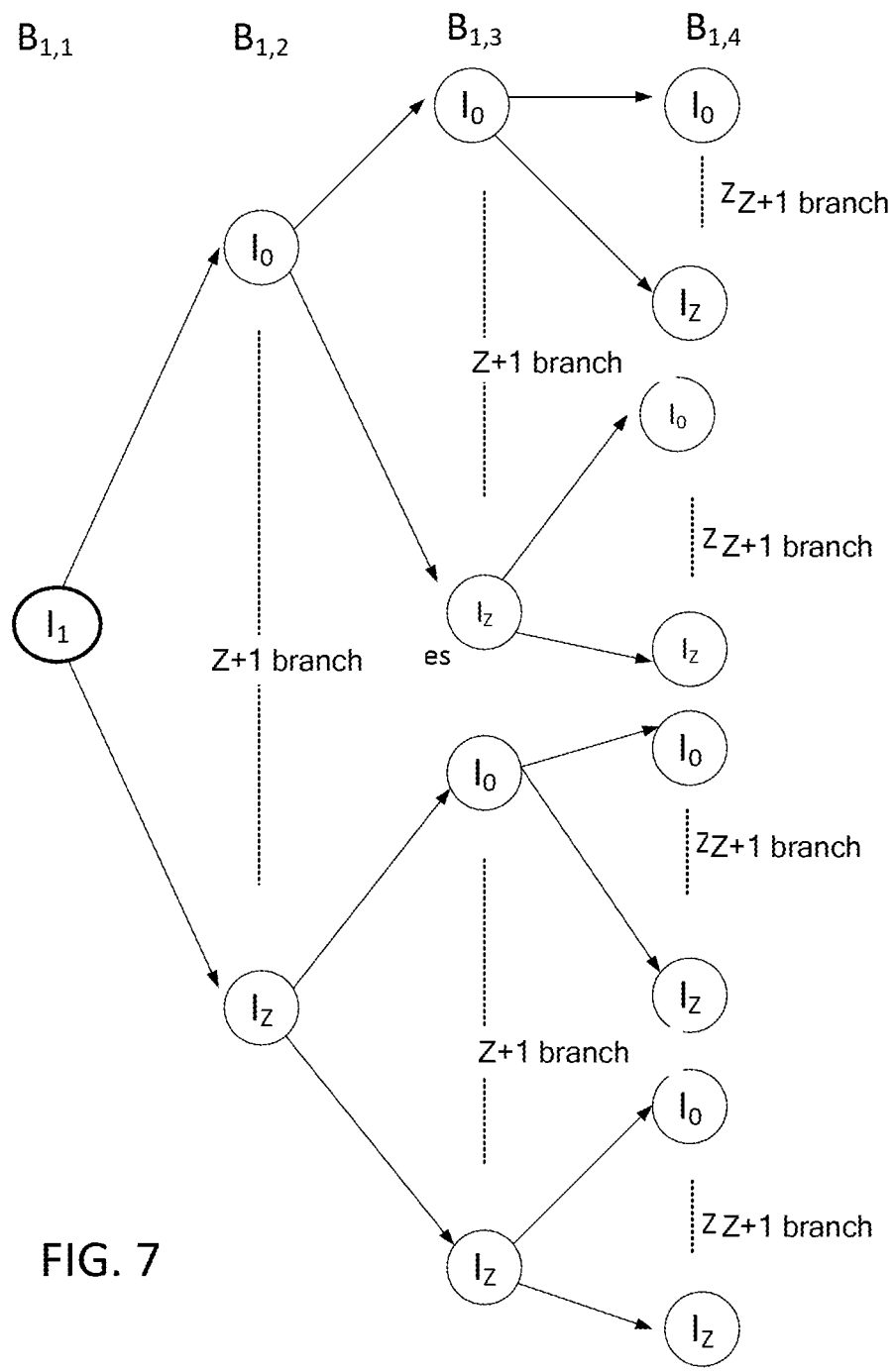
FIG. 7 is a diagram illustrating a trellis diagram for determining a best result from the second set of candidate blocks.

After the content of the block $B_{1,1}$ is determined, the window of the trellis diagram can be shifted to next level. Please refer to FIG. 6 in conjunction with FIG. 7. FIG. 6 is a diagram illustrating an exemplary embodiment of a second set of candidate blocks that are candidates of a second set of blocks of the parity check matrix. FIG. 7 is a diagram illustrating a trellis diagram for determining a best result from the second set of candidate blocks. Similarly, In FIG. 6, the second set of blocks of the parity check matrix comprises blocks $B_{1,2}$, $B_{1,3}$, and $B_{1,4}$. Now, the content of the block$_{1,1}$ is determined as the first candidate block $I_1$. For a second block in the M×N blocks, e.g. the block $B_{1,2}$, the content of the block can be determined as any block of all candidate blocks. For example, the content of the block $B_{1,2}$ can be determined as any one of candidate blocks $I_0, I_1, I_2, I_3, \ldots$ or $I_Z$. The content of the block $B_{1,3}$ can be determined as any one of candidate blocks $I_0, I_1, I_2, I_3, \ldots$ or $I_Z$. The content of the block $B_{1,4}$ can be determined as any one of candidate blocks $I_0, I_1, I_2, I_3, \ldots$ or $I_Z$. In FIG. 7, the trellis diagram illustrates all possible combinations of the candidate blocks. Each branch of the trellis diagram is a possible combination of the candidate blocks. A second set of candidate blocks that are candidates of a second set of blocks of the parity check matrix comprises all of the possible combinations of the candidate blocks, i.e. all branches of the trellis diagram. In one embodiment, as shown in the FIG. 6, the content of the block $B_{1,1}$ is determined as the first candidate block $I_1$, the content of the block $B_{1,2}$ is presumed as the second candidate block $I_2$, the content of the block $B_{1,3}$ is presumed as the third candidate block $I_3$, and the content of the block $B_{1,4}$ is presumed as the fourth candidate block $I_4$, which is a possible combination of the candidate blocks. The performance (result) of the parity check matrix having the possible combination, the content of block $B_{1,1}$=the first candidate block $I_1$, the block content of $B_{1,2}$=the second candidate block $I_2$, the content of block $B_{1,3}$=the third candidate block $I_3$, and the content of block $B_{1,4}$=the fourth candidate block $I_4$, can be estimated. Under the condition that the content of the block B1,1 is determined as the first candidate block $I_1$, all results corresponding to all possible combinations of the candidate blocks (i.e. the second set of candidate blocks) can be estimated. In other words, $(Z+1)^3$ results corresponding to $(Z+1)^3$ breaches branches can be estimated. The content of a second block, i.e. block $B_{1,2}$, can be determined according to a best result of the second estimated results. For example, the parity check matrix having the combination, the content of block $B_{1,1}$=the first candidate block $I_1$, the content of block $B_{1,2}$=the second candidate block $I_2$, the content of block $B_{1,3}$=the third candidate block $I_3$, and the content of block $B_{1,4}$=the fourth candidate block $I_4$, has a best performance. Hence, the content of the $block_{1,2}$ is determined as the second candidate block $I_2$.

Please note that one important rule for determining the performance is also considering the number of girth of a code. Hence, further illustrations can be omitted for brevity. In addition, other blocks of the parity check matrix can be generated in the similar way. Hence, further illustrations can be omitted for brevity. One advantage of the present embodiment is that the computation resource for determining the parity check matrix can be greatly reduced. Another advantage of the present embodiment is that most combinations of the candidate blocks can be found. Hence, though the code search may be not exhaustive, however, a relatively better code can be found. For further reducing the computation resource, the dependency between different columns or rows of the parity check matrix can be added. Further details are illustrated below.

Figure 8:
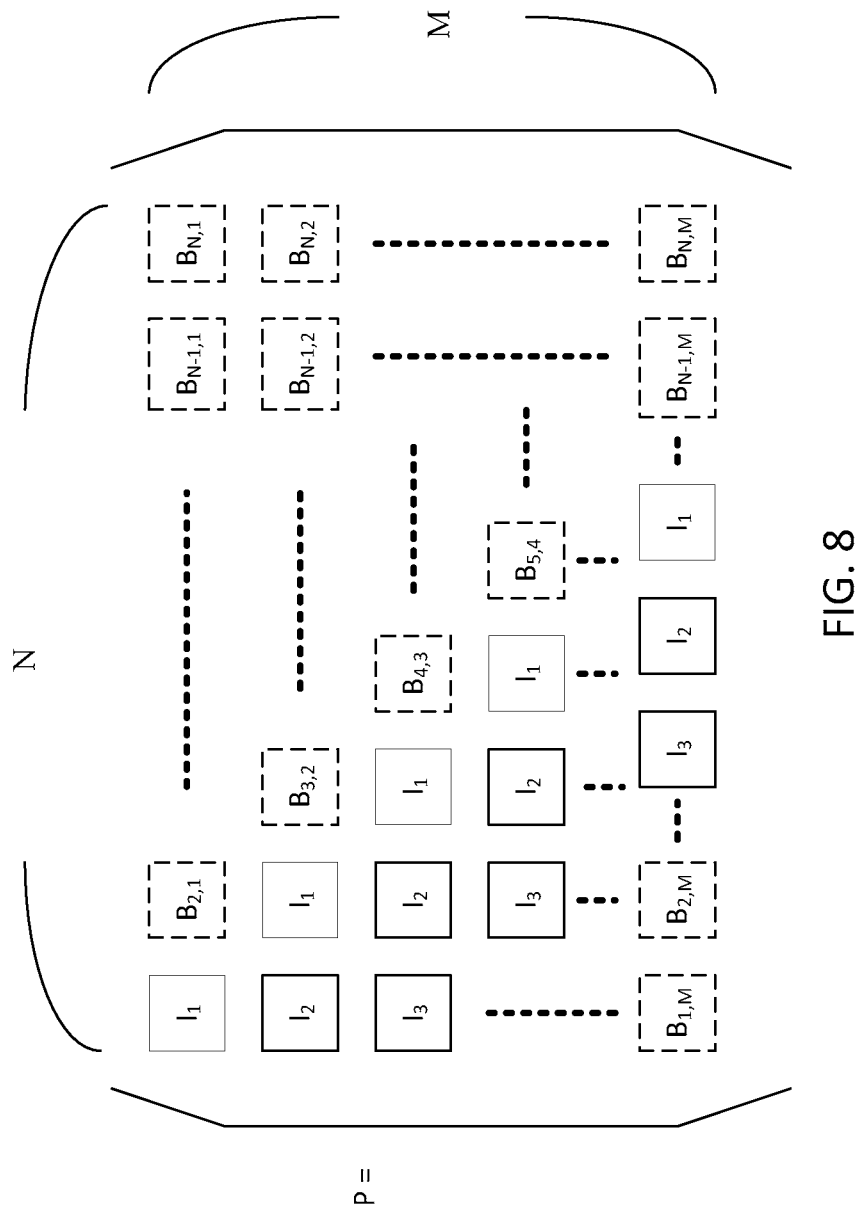
FIG. 8 is a diagram illustrating an exemplary embodiment of a first set of candidate blocks that are candidates of a first set of blocks of the parity check matrix.
Figure 9:
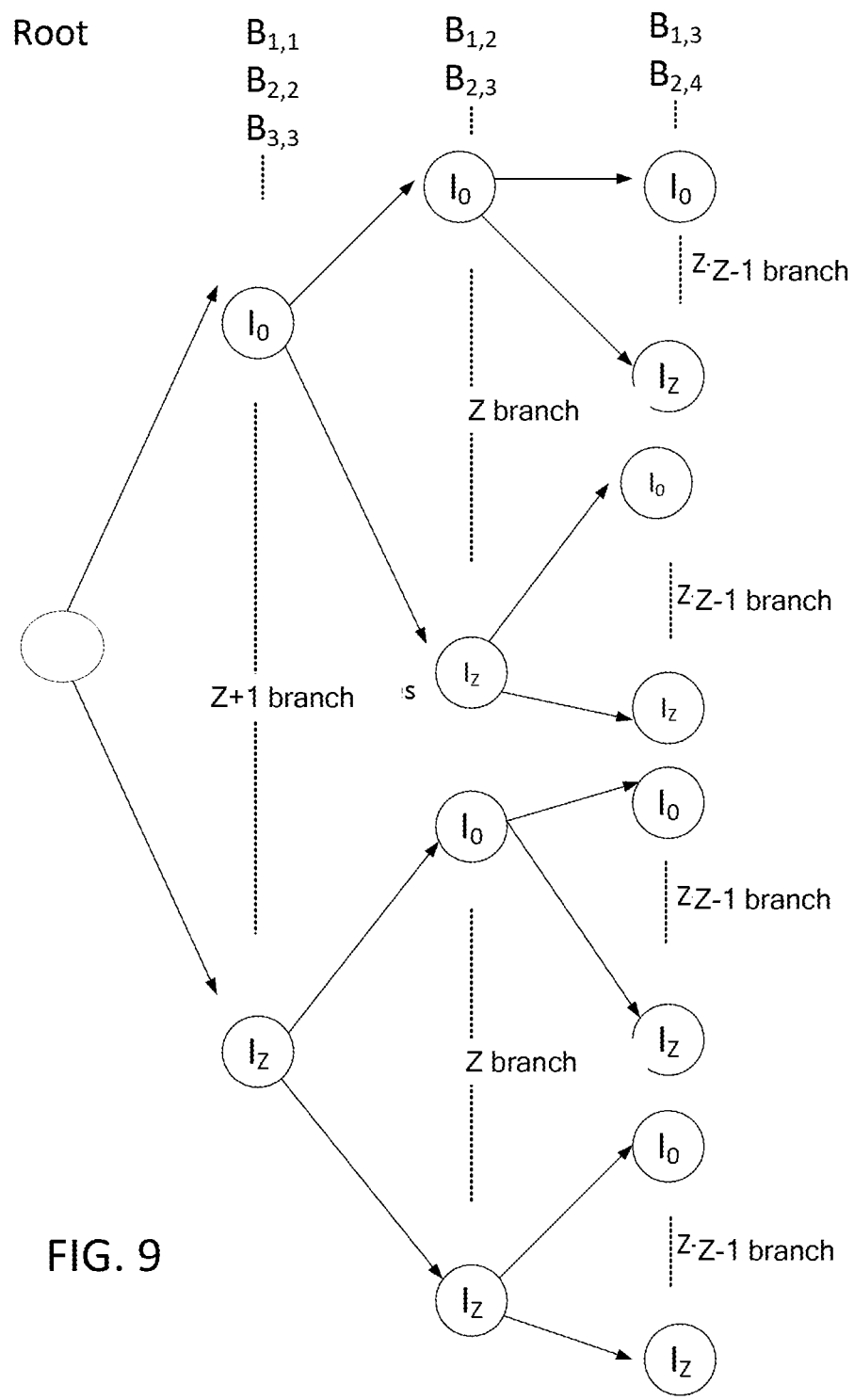
FIG. 9 is a diagram illustrating a trellis diagram for determining a best result from the first set of candidate blocks.

Please refer to FIG. 8 in conjunction with FIG. 9. FIG. 8 is a diagram illustrating an exemplary embodiment of a first set of candidate blocks that are candidates of a first set of blocks of the parity check matrix. FIG. 9 is a diagram illustrating a trellis diagram for determining a best result from the first set of candidate blocks. In FIG. 8, the first set of blocks of the parity check matrix comprises blocks $B_{1,1}$, $B_{1,2}$, $B_{1,3}$, $B_{2,2}$, $B_{2,3}$, $B_{2,4}$, $B_{3,3}$, $B_{3,4}$, $B_{3,5}$ ... and $B_{M,M}$, $B_{M-1,M}$, $B_{M-2,M}$. For a block in the M×N blocks, e.g. the block $B_{1,1}$, the content of the block can be determined as any block of all candidate blocks. For example, the content of the block $B_{1,1}$ can be determined as any one of candidate blocks $I_0$, $I_1$, $I_2$, $I_3$, ... or $I_Z$, except the candidate blocks that has been presumed or determined as content of other blocks. The content of the block $B_{1,2}$ can be determined as any one of candidate blocks $I_0$, $I_1$, $I_2$, $I_3$, ... or $I_Z$, except the candidate blocks that has been presumed or determined as content of other blocks. The content of the block $B_{1,3}$ can be determined as any one of candidate blocks $I_0$, $I_1$, $I_2$, $I_3$, ... or $I_Z$, except the candidate blocks that has been presumed or determined as content of other blocks. In addition, for further reduce the complexity, content of a block located in y column and x row of the M×N blocks and content of the block located in y+1 column and x+1 row of the M×N blocks should be the same. In other embodiments, content of a block located in y column and x row of the M×N blocks and content of the block located in y+2 column and x+1 row of the M×N blocks is the same, or content of a block located in y column and x row of the M×N blocks and content of the block located in y+1 column and x+2 row of the M×N blocks is the same. As long as there is dependency existed between different columns or rows of the parity check matrix. In FIG. 9, the trellis diagram illustrates all possible combinations of the candidate blocks. Each branch of the trellis diagram is a possible combination of the candidate blocks. A first set of candidate blocks that are candidates of a first set of blocks of the parity check matrix comprises all of the possible combinations of the candidate blocks, i.e. all branches of the trellis diagram. In one embodiment, as shown in the FIG. 8, the content of the block $B_{1,1}$, $B_{2,2}$, ..., and $B_{k,k}$ is presumed as the first candidate block $I_1$, the content of the block $B_{1,2}$, $B_{2,3}$, ..., and $B_{M-1,M}$ is presumed as the second candidate block $I_2$, and the content of the block $B_{1,3}$, $B_{2,4}$, ..., and $B_{M-2,M}$ is presumed as the third candidate block $I_3$, which is a possible combination of the candidate blocks. In other words, content of a block located in y column and x row of the M×N blocks and content of the block located in y+1 column and x+1 row of the M×N blocks should be presumed as the same content while estimating the performance of the parity check matrix. The performance (result) of the parity check matrix having the possible combination, the content of blocks $B_{1,1}$, $B_{2,2}$, ..., and $B_{M,M}$=the first candidate block $I_1$, the content of blocks $B_{1,2}$, $B_{2,3}$, ..., and $B_{M-1,M}$=the second candidate block $I_2$, and the content of block $B_{1,3}$, $B_{2,4}$, ..., and $B_{M-2,M}$=the third candidate block $I_3$, can be estimated. In addition, all results corresponding to all possible combinations of the candidate blocks (i.e. the first set of candidate blocks) can be estimated. In other words, $(Z+1)*Z*(Z-1)$ results corresponding to $(Z+1)*Z*(Z-1)$ branches can be estimated. The number of the first set of blocks is greatly increased and content of more blocks can be determined at the same time. The content of at plurality of first blocks, i.e. block $B_{1,1}$, $B_{2,2}$, ..., and $B_{M,M}$, can be determined according to a best result of the first estimated results. For example, the parity check matrix having the combination, the content of blocks $B_{1,1}$, $B_{2,2}$, ..., and $B_{M,M}$=the first candidate block $I_1$, the content of blocks $B_{1,2}$, $B_{2,3}$, ..., and $B_{M-1,M}$=the second candidate block $I_2$, and the content of block $B_{1,3}$, $B_{2,4}$, ..., and $B_{M-2,M}$=the third candidate block $I_3$, has a best performance. Hence, the content of the $blocks_{1,1}$ $B_{2,2}$, ..., and $B_{M,M}$ is determined as the first candidate block $I_1$. In other words, content of the block located in the first column of the M×N blocks and content of the block located in the second column of the M×N blocks have a dependency.

Figure 10:
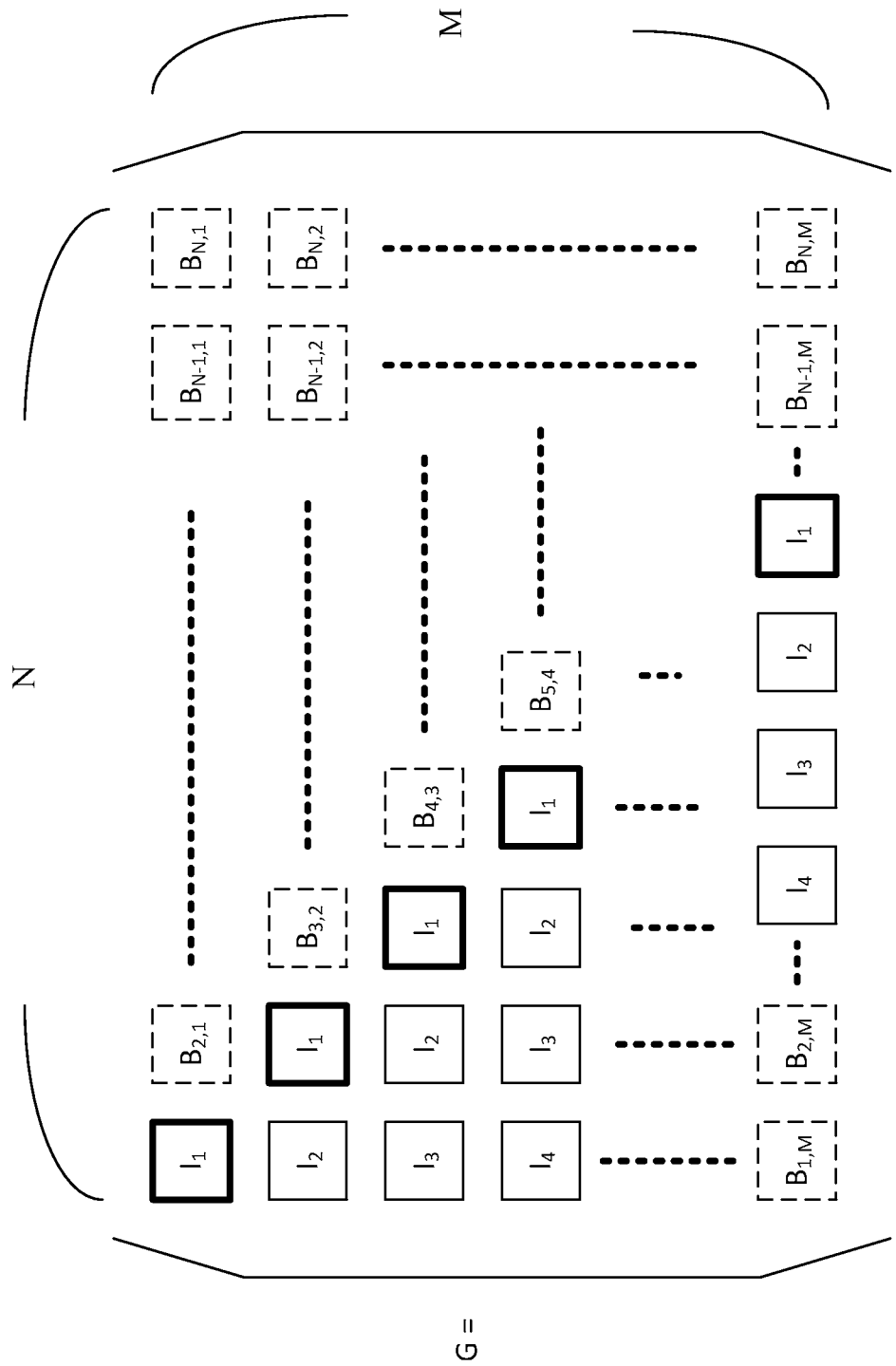
FIG. 10 is a diagram illustrating an exemplary embodiment of a second set of candidate blocks that are candidates of a second set of blocks of the parity check matrix.
Figure 11:
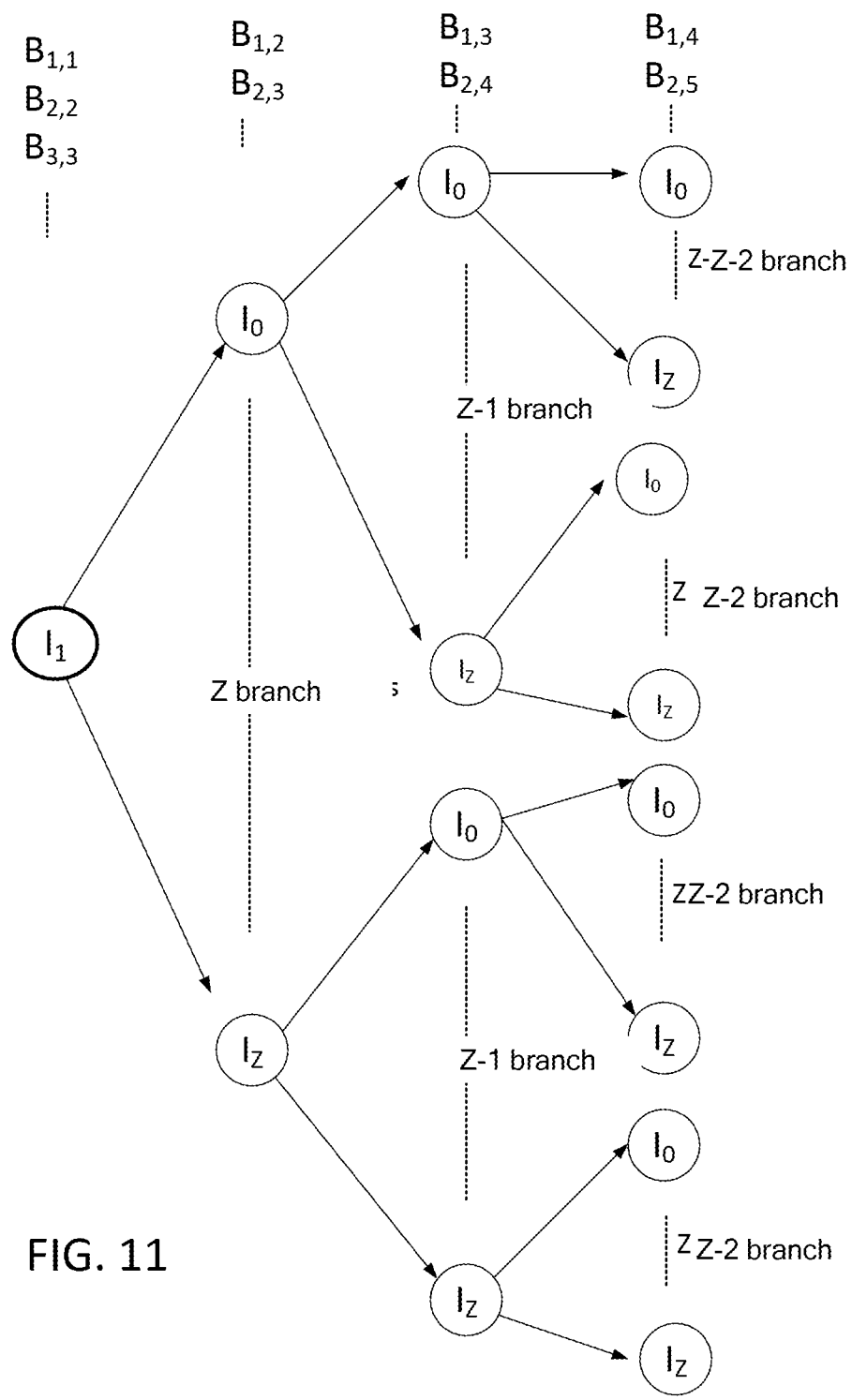
FIG. 11 is a diagram illustrating a trellis diagram for determining a best result from the second set of candidate blocks.

After the content of the blocks $B_{1,1}$ $B_{2,2}$, ..., and $B_{M,M}$ is determined, the window of the trellis diagram can be shifted to next level. Please refer to FIG. 10 in conjunction with FIG. 11. FIG. 10 is a diagram illustrating an exemplary embodiment of a second set of candidate blocks that are candidates of a second set of blocks of the parity check matrix. FIG. 11 is a diagram illustrating a trellis diagram for determining a best result from the second set of candidate blocks. Similarly, In FIG. 10, the second set of blocks of the parity check matrix comprises blocks $B_{1,2}$, $B_{1,3}$, $B_{1,4}$, $B_{2,3}$, $B_{2,4}$, $B_{2,5}$, $B_{3,4}$, $B_{3,5}$, $B_{3,6}$ ... and $B_{M-1,M}$, $B_{M-2,M}$, $B_{M-3,M}$. Now, the content of the $blocks_{1,1}$ $B_{2,2}$, ..., and $B_{M,M}$ is determined as the first candidate block $I_1$. For further reduce the complexity, according to an embodiment of the present invention, the first candidate block $I_1$ can not be determined as content of other blocks of the parity check matrix, however, which is not a limitation of the present invention. For second set of blocks in the M×N blocks, e.g. the blocks $B_{1,2}$, $B_{1,3}$, $B_{1,4}$, $B_{2,3}$, $B_{2,4}$, $B_{2,5}$, $B_{3,4}$, $B_{3,5}$, $B_{3,6}$ and $B_{M-1,M}$, $B_{M-2,M}$, $B_{M-3,M}$, the content of the blocks can be determined as any other block of all candidate blocks. For example, the content of the block $B_{1,2}$, $B_{2,3}$, $B_{3,4}$, ... and $B_{M-1,M}$ can be determined as any one of candidate blocks $I_0$, $I_2$, $I_3$, ... or $I_Z$, except the candidate blocks that has been presumed or determined as content of other blocks. The content of the block $B_{1,3}$, $B_{2,4}$, $B_{3,5}$, ... and $B_{M-2,M}$ can be determined as any one of candidate blocks $I_0$, $I_2$, $I_3$, ... or $I_Z$, except the candidate blocks that has been presumed or determined as content of other blocks. The content of the block $B_{1,4}, B_{2,5}, B_{3,6}, \ldots$ and $B_{M-3,M}$ can be determined as any one of candidate blocks $I_0, I_2, I_3, \ldots$ or $I_Z$, except the candidate blocks that has been presumed or determined as content of other blocks. Similarly, for further reduce the complexity, content of a block located in y column and x row of the M×N blocks and content of the block located in y+1 column and x+1 row of the M×N blocks should be the same. In FIG. 11, the trellis diagram illustrates all possible combinations of the candidate blocks. Each branch of the trellis diagram is a possible combination of the candidate blocks. A second set of candidate blocks that are candidates of a second set of blocks of the parity check matrix comprises all of the possible combinations of the candidate blocks, i.e. all branches of the trellis diagram. In one embodiment, as shown in the FIG. 10, the content of the block $B_{1,1}$ is determined as the first candidate block $I_1$, the content of the block $B_{1,2}, B_{2,3}, B_{3,4}, \ldots$ and $B_{M-1,M}$ is presumed as the second candidate block $I_2$, the content of the block $B_{1,3}, B_{2,4}, B_{3,5}, \ldots$ and $B_{M-2,M}$ is presumed as the third candidate block $I_3$, and the content of the block $B_{1,4}, B_{2,5}, B_{3,6}, \ldots$ and $B_{M-3,M}$ is presumed as the fourth candidate block $I_4$, which is a possible combination of the candidate blocks. The performance (result) of the parity check matrix having the possible combination, the content of block $B_{1,1}, B_{2,2}, \ldots,$ and $B_{M,M}$=the first candidate block $I_1$, the content of block $B_{1,2}, B_{2,3}, B_{3,4}, \ldots$ and $B_{M-1,M}$=the second candidate block $I_2$, the block $B_{1,3}, B_{2,4}, B_{3,5}, \ldots$ and $B_{M-2,M}$=the third candidate block $I_3$, and the block $B_{1,4}, B_{2,5}, B_{3,6}, \ldots$ and $B_{M-2,M}$=the fourth candidate block $I_4$, can be estimated. Under the condition that the content of the block $B_{1,1}, B_{2,2}, \ldots,$ and $B_{M,M}$ is determined as the first candidate block $I_1$, all results corresponding to all possible combinations of the candidate blocks (i.e. the second set of candidate blocks) can be estimated. In other words, $Z*(Z-1)*(Z-2)$ results corresponding to the branches can be estimated. The content of a plurality of second blocks, i.e. blocks $B_{1,2}, B_{2,3}, B_{3,4}, \ldots$ and $B_{M-1,M}$, can be determined according to a best result of the second estimated results. For example, the parity check matrix having the combination, the content of block $B_{1,1}, B_{2,2}, \ldots,$ and $B_{M,M}$=the first candidate block $I_1$, the content of block $B_{1,2}, B_{2,3}, B_{3,4}, \ldots$ and $B_{M-1,M}$=the second candidate block $I_2$, the block $B_{1,3}, B_{2,4}, B_{3,5}, \ldots$ and $B_{M-2,M}$=the third candidate block $I_3$, and the block $B_{1,4}, B_{2,5}, B_{3,6}, \ldots$ and $B_{M-3,M}$=the fourth candidate block $I_4$, has a best performance. Hence, the content of the blocks $B_{1,2}, B_{2,3}, B_{3,4}, \ldots$ and $B_{M-1,M}$ is determined as the second candidate block $I_2$.

Please note that one important rule for determining the performance is also considering the number of girth of a code. Hence, further illustrations can be omitted for brevity. In addition, other blocks of the parity check matrix can be generated in the similar way. Hence, further illustrations can be omitted for brevity. One advantage of the present embodiment is that the computation resource for determining the parity check matrix can be greatly reduced. Another advantage of the present embodiment is that most combinations of the candidate blocks can be found. Hence, though the code search executed by the present embodiment may be near exhaustive, and a relatively better code can be found.

Those skilled in the art will readily observe that numerous modifications and alterations of the device and method may be made while retaining the teachings of the invention.

What is claimed is:

1. A method for determining a parity check matrix utilized in a flash memory system, wherein the flash memory system reads data from a flash memory and decodes the data with the parity check matrix, and the parity check matrix defines a low-density parity check code and comprises M×N blocks, M being a number of blocks of a column in the parity check matrix and N being a number of blocks of a row in the parity check matrix, the method comprises:
   generating a first set of candidate blocks as candidates of a first set of blocks of the M×N blocks;
   calculating a plurality of first estimated results corresponding to the first set of candidate blocks;
   determining content of at least a first block of the M×N blocks according to a best result of the first estimated results;
   generating a second set of candidate blocks as candidates of a second set of blocks of the M×N blocks;
   calculating a plurality of second estimated results corresponding to the second set of candidate blocks by considering the content of the first block;
   determining content of a second block of the M×N blocks according to the second estimated results.

2. The method of claim 1, wherein the step of generating the first set of candidate blocks as candidates of the first set of blocks of the M×N blocks further comprises:
   determining a size of a window as W; and
   generating a first set of $Z^W$ candidate blocks as candidates of $B_1-B_W$ blocks of the M×N blocks; and
   wherein the step of generating the second set of candidate blocks as candidates of the second set of blocks of the M×N blocks further comprises:
   generating a second set of $Z^W$ candidate blocks as candidates of $B_2-B_{W+1}$ blocks of the M×N blocks.

3. The method of claim 1, wherein the best result of the first estimated results is determined by considering a number of girth four of each result of the first estimated results.

4. The method of claim 3, wherein the best result has a minimum number of girth four, and if a plurality of results of the first estimated results have the same number of girth four, considering a number of girth six of each result of the first estimated results.

5. The method of claim 4, wherein the best result has a minimum number of girth six, and if a plurality of results of the first estimated results have the same number of girth six, arbitrarily determining a result of the results as the best result.

6. The method of claim 1, wherein the first set of blocks comprise a block located in a first column of the M×N blocks and a block located in a second column of the M×N blocks, and content of the block located in the first column of the M×N blocks and content of the block located in the second column of the M×N blocks have a dependency.

7. The method of claim 6, wherein the block located in the first column of the M×N blocks and the block located in the second column of the M×N blocks are located in different rows of the M×N blocks.

8. The method of claim 7, wherein the block located in the first column of the M×N blocks is located in y column and x row of the M×N blocks and the block located in the second column of the M×N blocks is located in y+1 column and x+1 row of the M×N blocks.

9. The method of claim 1 further comprises: determining content of first blocks of the M×N blocks according to the best result of the first estimated results.

10. The method of claim 1, wherein content of the second set of candidate blocks does not comprise the content of the first block.

11. A flash memory system utilizes a parity check matrix, wherein the flash memory system reads data from a flash memory and decodes data with the parity check matrix, and the parity check matrix defines a low-density parity check code and comprises M×N blocks, M being a number of blocks of a column in the parity check matrix and N being a number of blocks of a row in the parity check matrix, and the parity check matrix is determined as flowing steps:

generating a first set of candidate blocks as candidates of a first set of blocks of the M×N blocks;

calculating a plurality of first estimated results corresponding to the first set of candidate blocks;

determining content of at least a first block of the M×N blocks according to a best result of the first estimated results;

generating a second set of candidate blocks as candidates of a second set of blocks of the M×N blocks;

calculating a plurality of second estimated results corresponding to the second set of candidate blocks by considering the content of the first block;

determining content of a second block of the M×N blocks according to the second estimated results.

12. The flash memory system of claim 11, wherein the step of generating the first set of candidate blocks as candidates of the first set of blocks of the M×N blocks further comprises:

determining a size of a window as W; and generating a first set of $Z^W$ candidate blocks as candidates of $B_1$-$B_W$ blocks of the M×N blocks; and wherein the step of generating the second set of candidate blocks as candidates of the second set of blocks of the M×N blocks further comprises:

generating a second set of $Z^W$ candidate blocks as candidates of $B_2$-$B_{W+1}$ blocks of the M×N blocks.

13. The flash memory system of claim 11, wherein the best result of the first estimated results is determined by considering a number of girth four of each result of the first estimated results.

14. The flash memory system of claim 13, wherein the best result has a minimum number of girth four, and if a plurality of results of the first estimated results have the same number of girth four, considering a number of girth six of each result of the first estimated results.

15. The flash memory system of claim 14, wherein the best result has a minimum number of girth six, and if a plurality of results of the first estimated results have the same number of girth six, arbitrarily determining a result of the results as the best result.

16. The flash memory system of claim 11, wherein the first set of blocks comprise a block located in a first column of the M×N blocks and a block located in a second column of the M×N blocks, and content of the block located in the first column of the M×N blocks and content of the block located in the second column of the M×N blocks have a dependency.

17. The flash memory system of claim 16, wherein the block located in the first column of the M×N blocks and the block located in the second column of the M×N blocks are located in different rows of the M×N blocks.

18. The flash memory system of claim 17, wherein the block located in the first column of the M×N blocks is located in y column and x row of the M×N blocks and the block located in the second column of the M×N blocks is located in y+1 column and x+1 row of the M×N blocks.

19. The flash memory system of claim 11, wherein content of first blocks of the M×N blocks is determined according to the best result of the first estimated results.

20. The flash memory system of claim 11, content of the second set of candidate blocks does not comprise the content of the first block.

* * * * *